US 6,704,976 B1

(12) United States Patent
Chen

(10) Patent No.: US 6,704,976 B1
(45) Date of Patent: Mar. 16, 2004

(54) FASTENER FOR A HEAT-RADIATOR

(76) Inventor: Wan-Tien Chen, 10F, No. 106-2, Sec. 2, Chungshan N. Rd., Taipei (TW)

( * ) Notice: Subject to any disclaimer, the term of this patent is extended or adjusted under 35 U.S.C. 154(b) by 0 days.

(21) Appl. No.: 10/227,868

(22) Filed: Aug. 27, 2002

(51) Int. Cl.[7] .................. A44B 21/00; H05K 7/20
(52) U.S. Cl. ............... 24/459; 24/296; 24/517; 24/457; 174/16.3; 361/704
(58) Field of Search ............ 24/459, 517, 457, 24/518, 296; 165/80.3; 174/16.3; 361/704, 710, 386

(56) References Cited

U.S. PATENT DOCUMENTS

| | | | | |
|---|---|---|---|---|
| 3,757,031 A | * | 9/1973 | Izraeli ................... | 24/459 |
| 5,208,731 A | * | 5/1993 | Blomquist ............. | 174/16.3 |
| 5,241,453 A | * | 8/1993 | Bright et al. .......... | 361/704 |
| 5,847,928 A | * | 12/1998 | Hinshaw et al. ....... | 361/704 |
| 5,889,653 A | * | 3/1999 | Clemens et al. ....... | 361/704 |
| 6,049,457 A | * | 4/2000 | Lee ....................... | 174/16.3 |
| 6,272,722 B1 | * | 8/2001 | Lai ........................ | 24/459 |
| 6,496,374 B1 | * | 12/2002 | Caldwell ............... | 361/709 |

* cited by examiner

Primary Examiner—Victor Sakran
(74) Attorney, Agent, or Firm—Bacon & Thomas

(57) ABSTRACT

A fastener for a heat-radiator is composed of a frame and two strips. The frame has two parallel first sides and two parallel second sides perpendicular to the first sides. Each first side has a bottom part and two bevel parts respectively extending outwards and upwards from two ends of the bottom part. Each second side has at least one aperture defined therethrough. The strips are respectively mounted on the second sides of the frame. By changing the strips, a heat-radiator can be installed on a Pentium® III processor or a Pentium® 4 processor.

4 Claims, 7 Drawing Sheets

FASTENER FOR A HEAT-RADIATOR

BACKGROUND OF THE INVENTION

1. Field of the Invention

The present invention is related to a heat-radiator for a CPU, and more particularly to a fastener for a heat-radiator.

2. Description of Related Art

CPU is the most important component in a computer and will generate a lot of heat in operating. A heat-radiator must be installed on the CPU for lowering the temperature of the operating CPU. Most computers use Pentium® III or Pentium® 4 processors made by Intel Corporation as CPUs. For Pentium® III processors, the heat-radiators are directly fastened on sockets on which the processors are-installed. For Pentium®4 processors, Intel Corporation has presented a standard radiator seat, whereby, the heat-radiators for Pentium®4 processors are installed on the seat. Thus, the fasteners for installing the heat-radiators for Pentium III or Pentium® 4 processors are different. When a user wants to replace a Pentium® III processor with a Pentium® 4 processors, the heat-radiator with fasteners specially designed for the processor seat must be used, which increases the user's outlay.

Therefore, the invention provides a fastener for a heat-radiator to mitigate and/or obviate the aforementioned problems.

SUMMARY OF THE INVENTION

The main objective of the invention is to provide a fastener which can used for installing a heat-radiator on a Pentium III or a Pentium 4 processor.

Other objects, advantages and novel features of the invention will become more apparent from the following detailed description when taken in conjunction with the accompanying drawings.

DETAILED DESCRIPTION OF THE PREFERRED EMBODIMENT

Figure 1:
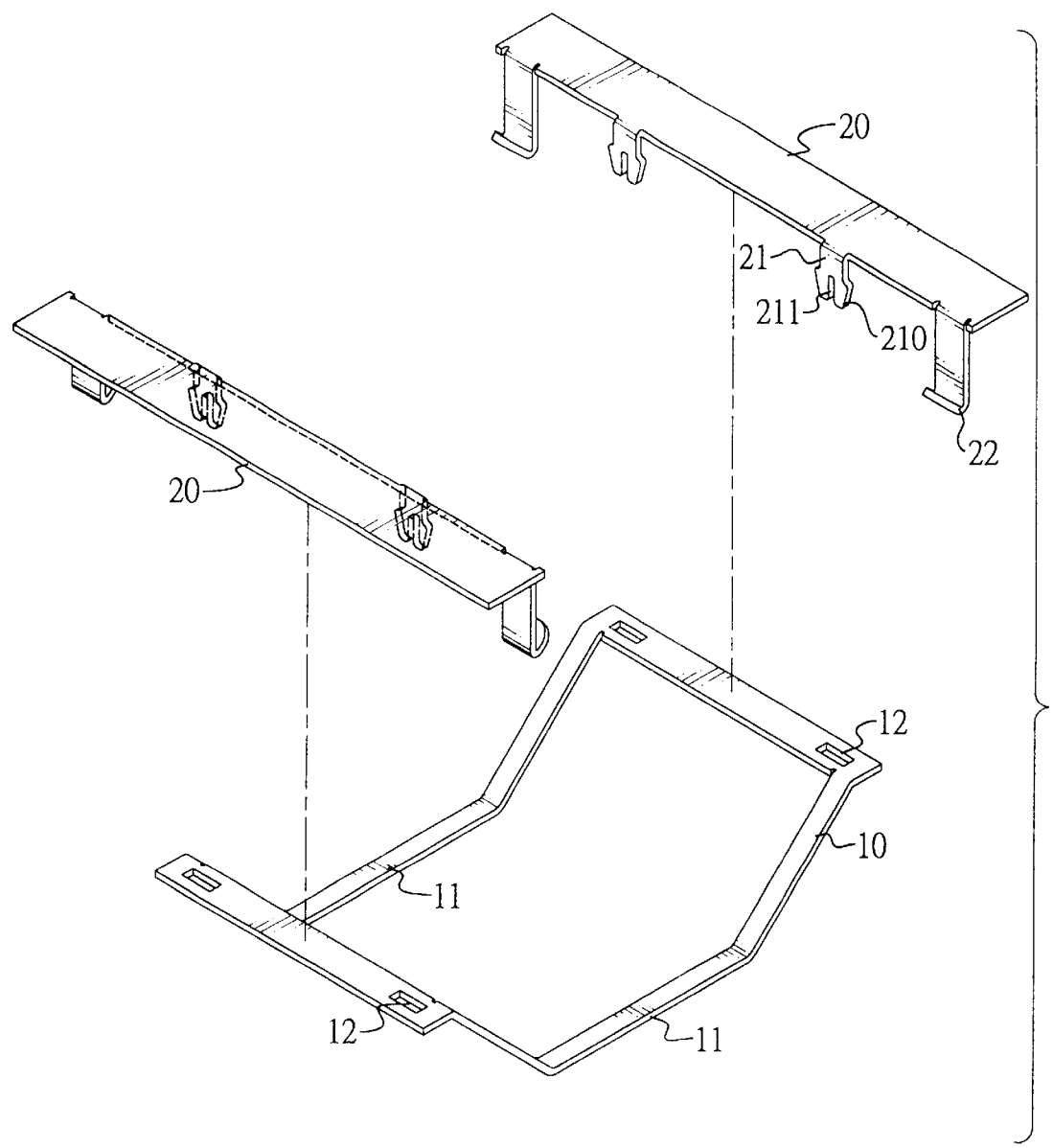
FIG. 1 is an exploded perspective view of a first embodiment of a fastener in accordance with the invention.
Figure 2:
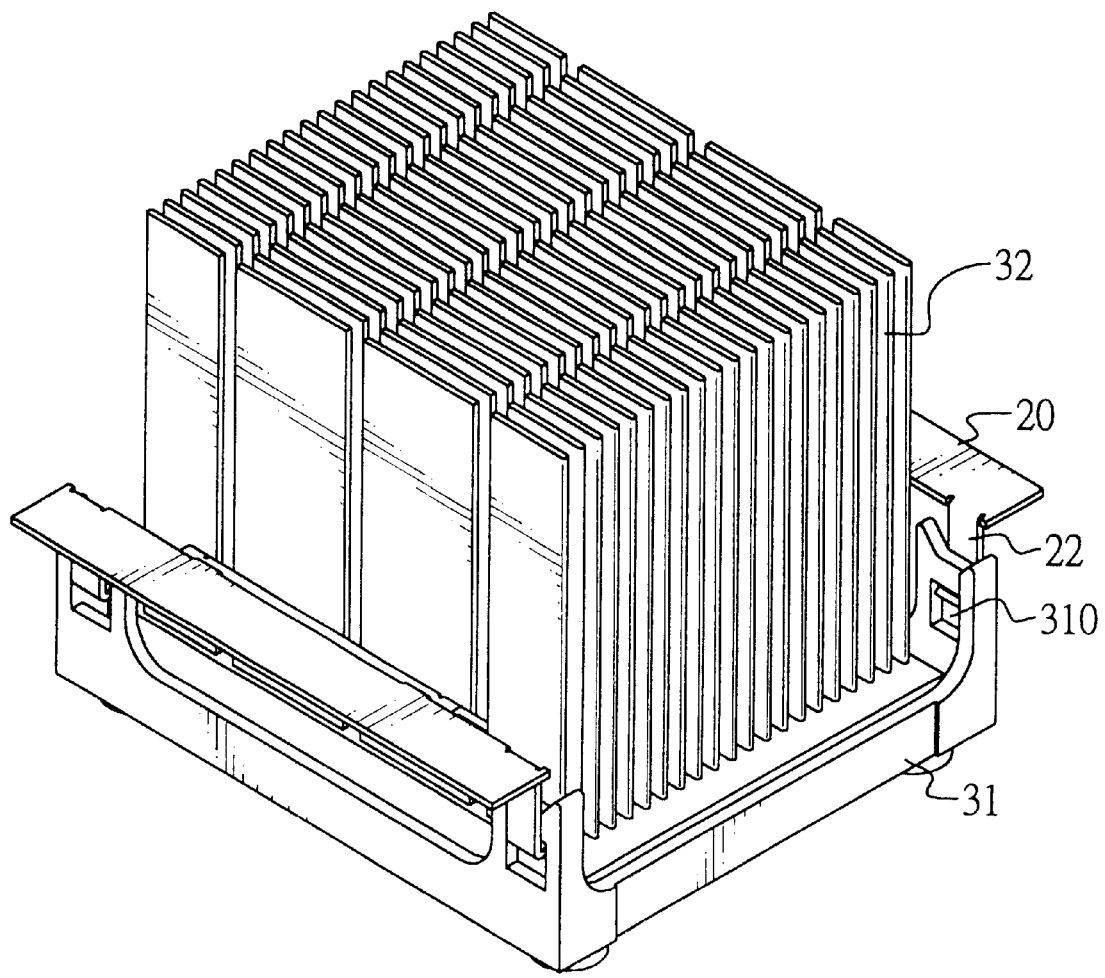
FIG. 2 is a perspective view showing a heat-radiator is installed by the fastener of FIG. 1.
Figure 3:
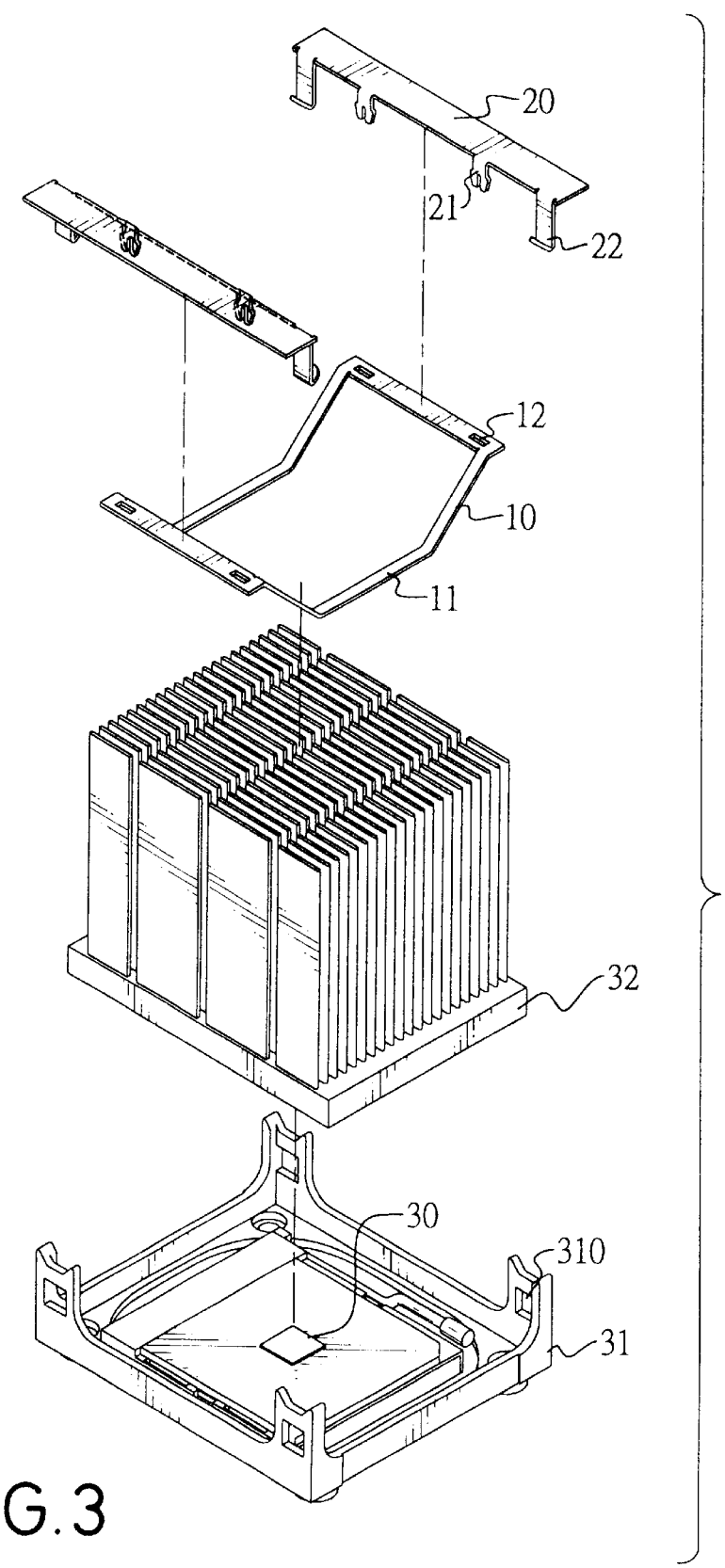
FIG. 3 is an exploded perspective view of FIG. 2.
Figure 4:
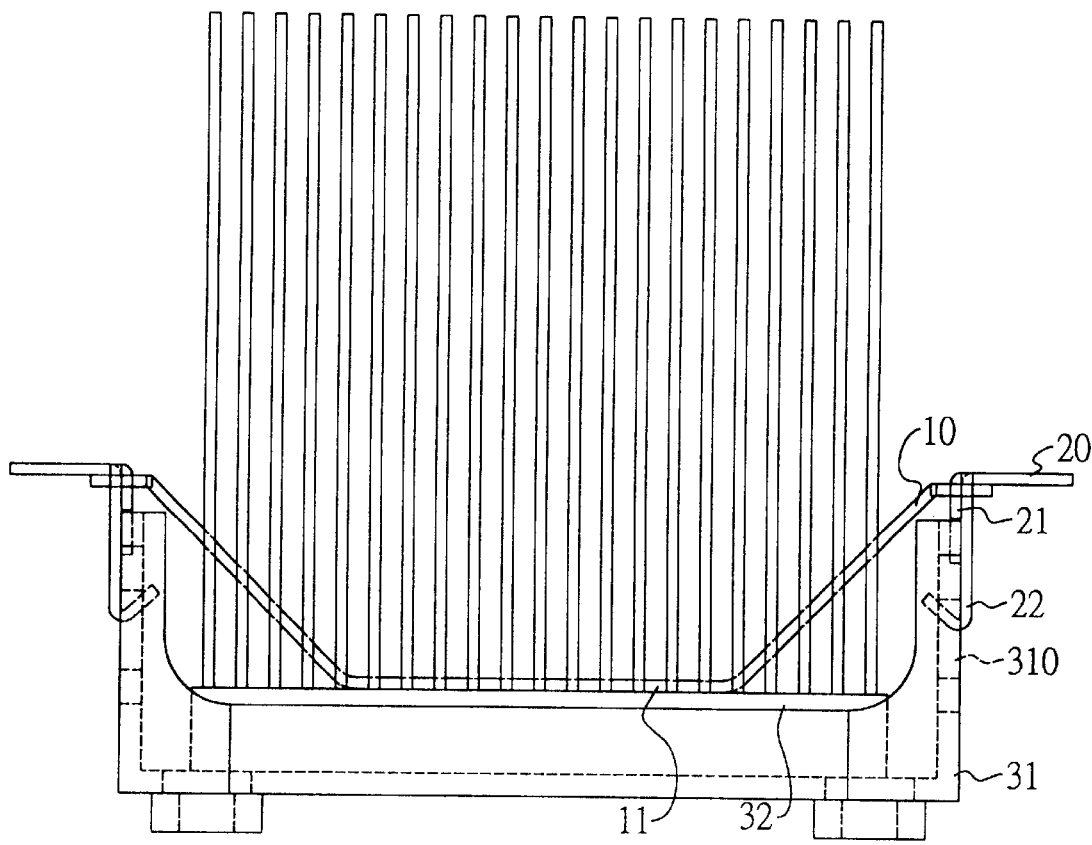
FIG. 4 is a sectional view of FIG. 2.

Referring to FIGS. 1–4, in accordance with a first embodiment of the invention, a fasten is composed of a frame (10) and two first strips (20). The frame (10) has two parallel long sides (11) and two parallel short sides (not numbered) perpendicular to the long sides (11). Each of the long sides (11), of which a section is V-like, has a bottom part and two bevel parts respectively extending outwards and upwards from two ends of the bottom part. Each of the short sides has at least one aperture (.12) defined therethrough. In this embodiment, two first apertures (12) are defined through each short side.

Each of the first strips (20) has at least one first ear (21) to correspond the aperture (12). Two barbs (22) are respectively formed at two ends of the first strip (20) and perpendicular to the first strip (20). The first ear (21) has two legs (210) and a notch (211) defined between the legs (210). A size between outer sides of the legs (210) is larger than a maximum diameter of the aperture (12). When the ear (21) is inserted in the aperture (12), the legs (210) can be compressed towards the notch (211) to reduce the size between the outer sides of the legs (210) for passing through the aperture (12). Thereafter, the legs (210) can recover the original size and is secured in the aperture (12).

The first embodiment of the fastener is used for installing a heat-radiator (32) on a seat (31) outside a Pentium® 4 processor (30). The strips (20) are first mounted on the short sides of the frame (10) by inserting ears (21) in the respective apertures (12). The long sides (11) are positioned in fins (not numbered) of the heat-radiator (32). The barbs (22) on the strips (20) are respectively attached in holes. (310) of the seat (31) and the heat-radiator (32) is tightly secured on the seat (31).

Figure 5:
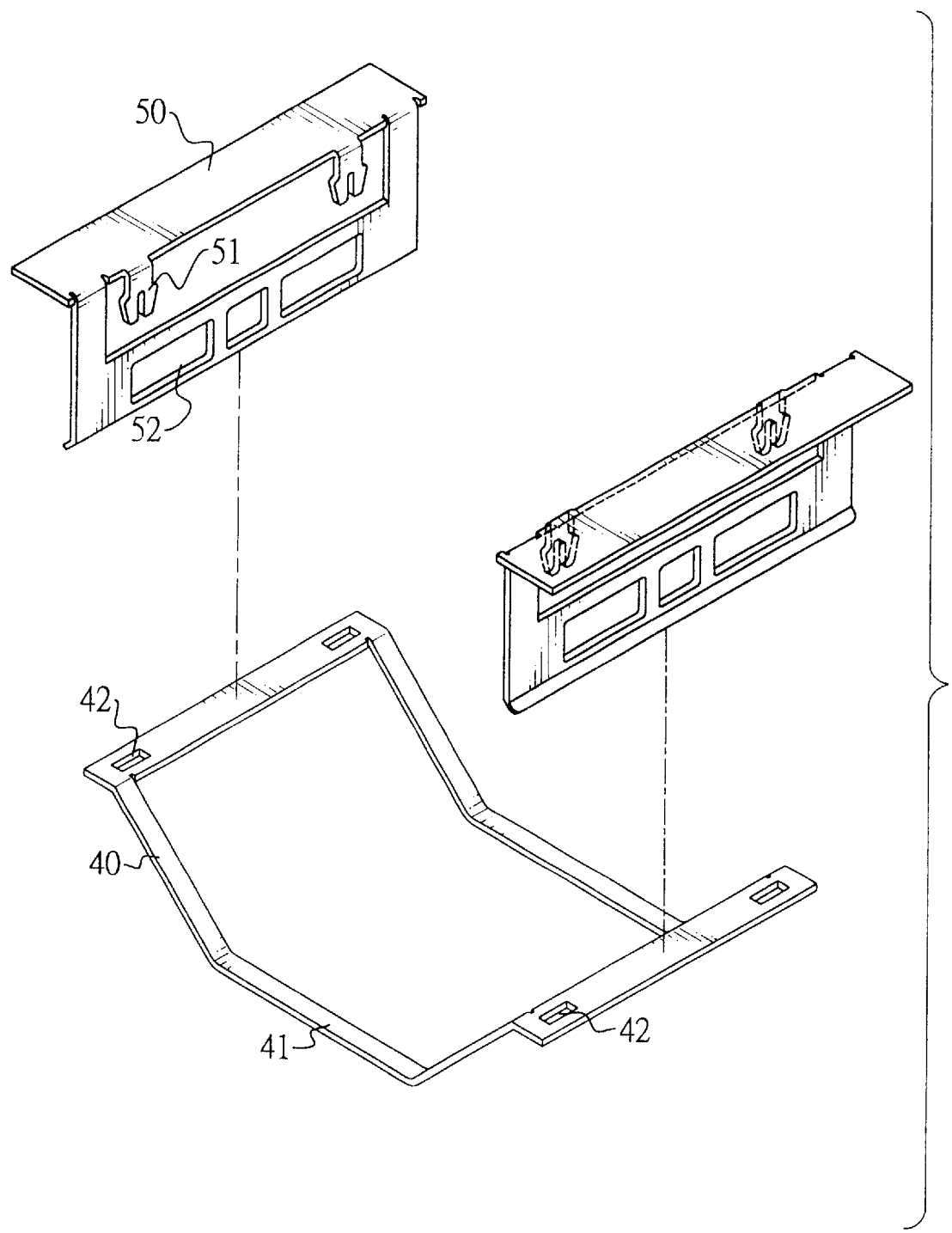
FIG. 5 is an exploded perspective view of a second embodiment of the fastener in accordance with the invention.
Figure 6:
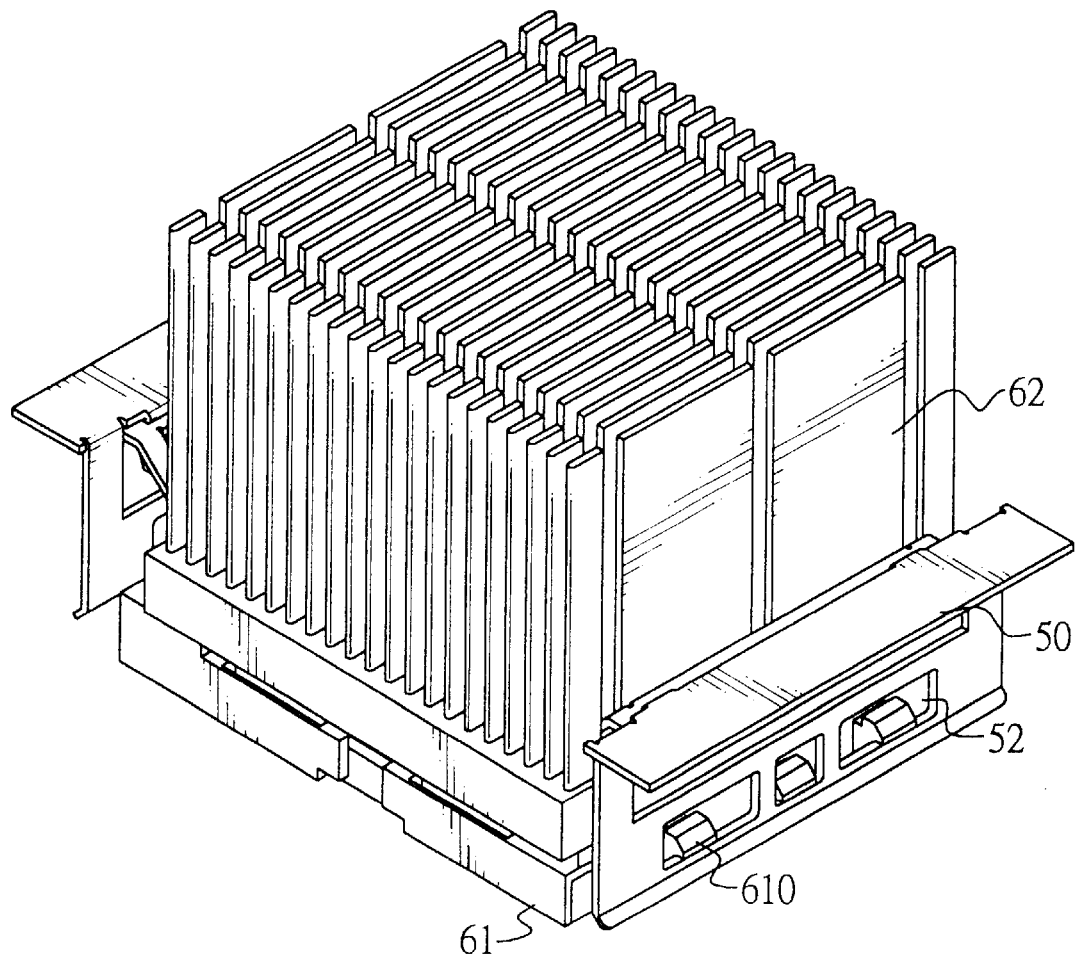
FIG. 6 is a perspective view showing a heat-radiator is installed by the fastener of FIG. 5.
Figure 7:
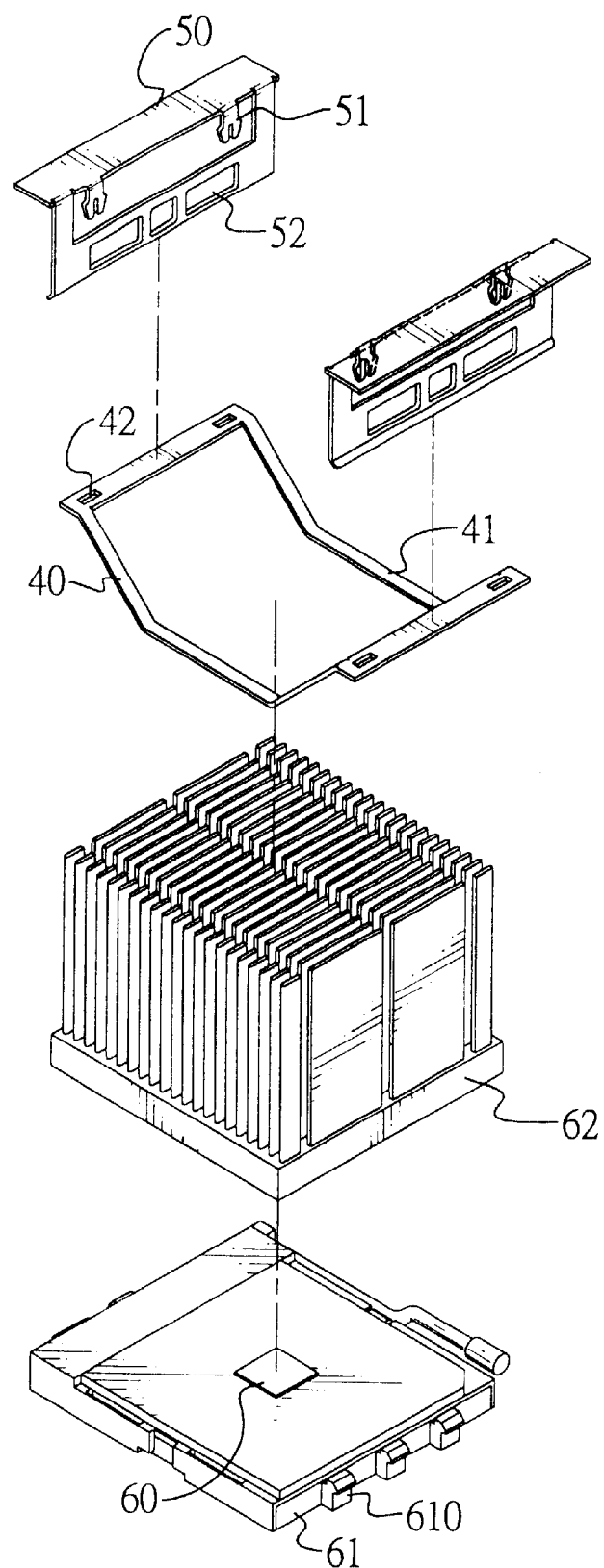
FIG. 7 is an exploded perspective view of FIG. 6.

Referring to FIG. 5–7, in a second embodiment of the invention, the fastener has a frame (40) and two second strips (50). The frame (40) the same as that of the first embodiment of the invention, has two parallel long sides (41) and two parallel short sides (not numbered) perpendicular to the long sides (41). Each of the long sides (41), of which a section is V-like, has a bottom part and two bevel parts respectively extending outwards and upwards from two ends of the bottom part. Each of the short sides has at least one aperture (42) defined therethrough. In this embodiment, two first apertures (42) are defined through each short side.

Each of the second strips (50) has at least one first ear (51) to correspond the aperture (42). A U-like plate (not numbered) is formed on the second strip (50) and perpendicular to the second strip (50). A plurality of windows (52) is defined through the U-like plate.

Similar to the first ear (21), the second ear (51) also has two legs and a notch defined between the legs. When the second ear (51) is inserted in the aperture (42), the legs can be compressed towards the notch for passing through the aperture (42). Thereafter, the legs can recover their original size and are secured in the a aperture (4).

The second embodiment of the fastener is used for installing a heat-radiator (62) on a socket (61) for a Pentium® III processor (60). The strips (50) are first mounted on the short sides of the frame (40) by inserting second ears (51) in the respective apertures (42). The long sides (41) are positioned in fins (not numbered) of the heat-radiator (62). Protrusions. (610) on side surfaces of the socket (61) are respectively engaged in the windows (52) of the strip (50), so that the heat-radiator (62) is-tightly secured on the socket(61).

According to the present invention, when a user wants to replace a Pentium® III processor with a Pentium®4 processor, the former heat-radiator can be used by changing the strips of the fasteners. Thus, the outlay of the user is low.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A fastener for a heat-radiator comprising:

a frame (10), the frame (10) having two parallel first sides (11) and two parallel second sides perpendicular to the first sides (11), each first side (11) having a bottom part and two bevel parts respectively extending outwards and upwards from two ends of the bottom part, each second side having at least one aperture (12) defined therethrough; and two strips (20 respectively mounted on the second sides of the frame (10), each strip (20) having at least one ear (21) to insert through the art least one aperture (12) of the frame (10), and two barbs (22) formed at two ends of the strip (20).

2. The fastener as claimed in claim 1, wherein the ear (21) has two legs (210) and a notch (211) defined between the legs (21).

3. A fastener for a heat-radiator comprising:

a frame (40), the frame (40) having two parallel first sides (41) and two parallel second sides perpendicular to the first sides (41), each first side (41) having a bottom part and two bevel parts respectively extending outwards and upwards from two ends of the bottom part, each second side having at least one aperture (42) defined therethrough; and two strips (50) respectively mounted on the second sides of the frame (40), each strip (50) having at least one ear (51) to insert through the art least one aperture (42) of the frame (40), and a U-like plate perpendicular to the second strip (50) and having a plurality of windows (52) defined through the U-like plate.

4. The fastener as claimed in claim 3, wherein the ear (21) has two legs (210) and a notch (211) defined between the legs (210).

\* \* \* \* \*